United States Patent
Nakako et al.

(10) Patent No.: US 9,550,940 B2
(45) Date of Patent: Jan. 24, 2017

(54) ETCHING MATERIAL

(71) Applicant: HITACHI CHEMICAL COMPANY, LTD., Tokyo (JP)

(72) Inventors: Hideo Nakako, Ibaraki (JP); Yasushi Kumashiro, Ibaraki (JP); Takaaki Noudou, Ibaraki (JP); Maki Inada, Ibaraki (JP); Kyoko Kuroda, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 14/436,287

(22) PCT Filed: Oct. 11, 2013

(86) PCT No.: PCT/JP2013/006074
§ 371 (c)(1),
(2) Date: Apr. 16, 2015

(87) PCT Pub. No.: WO2014/061245
PCT Pub. Date: Apr. 24, 2014

(65) Prior Publication Data
US 2015/0299568 A1  Oct. 22, 2015

(30) Foreign Application Priority Data
Oct. 16, 2012  (JP) ................. 2012-229276

(51) Int. Cl.
C09K 13/08 (2006.01)
C09K 13/00 (2006.01)
H01L 31/0224 (2006.01)
H01L 21/311 (2006.01)
H01L 31/18 (2006.01)

(52) U.S. Cl.
CPC .......... C09K 13/00 (2013.01); H01L 21/31111 (2013.01); H01L 31/022425 (2013.01); H01L 31/18 (2013.01); *Y02E 10/50* (2013.01)

(58) Field of Classification Search
CPC . C09D 487/04; G03C 7/30529; G03C 7/3835; H01L 21/302; H01L 21/31105; H01L 21/30609; C09K 13/06
USPC ........ 252/79.1, 79.2, 79.3, 79.4; 216/24, 26, 216/99, 107
See application file for complete search history.

(56) References Cited

U.S. PATENT DOCUMENTS

| | | | |
|---|---|---|---|
| 5,965,465 A | 10/1999 | Rath et al. | |
| 6,066,267 A * | 5/2000 | Rath ................. | H01L 21/31116 252/79.2 |
| 8,551,366 B2 * | 10/2013 | Yoshida .................. | C08K 5/34 252/500 |
| 2004/0242019 A1 * | 12/2004 | Klein ..................... | C09K 13/04 438/757 |
| 2006/0183654 A1 * | 8/2006 | Small .................. | C11D 7/3281 510/165 |
| 2008/0121621 A1 | 5/2008 | Stockum et al. | |
| 2008/0152835 A1 | 6/2008 | Mayers et al. | |
| 2008/0203060 A1 | 8/2008 | Hara et al. | |
| 2009/0071540 A1 | 3/2009 | Klein et al. | |
| 2009/0142880 A1 * | 6/2009 | Weidman ........ | H01L 31/022425 438/98 |
| 2009/0283141 A1 | 11/2009 | Bentzen et al. | |
| 2009/0302001 A1 | 12/2009 | Mayers et al. | |
| 2011/0048531 A1 * | 3/2011 | Lee ................. | H01L 31/022425 136/256 |
| 2013/0146342 A1 * | 6/2013 | Eom ........................ | C25D 5/02 174/257 |

FOREIGN PATENT DOCUMENTS

| | | |
|---|---|---|
| CN | 101421851 A | 4/2009 |
| JP | 11-121442 A | 4/1999 |
| JP | 2005-506705 A | 3/2005 |
| JP | 2008-527698 A | 7/2008 |
| JP | 2010-087154 A | 4/2010 |
| JP | 2010-512028 A | 4/2010 |
| TW | 200849371 | 12/2008 |
| WO | 2010/139390 A1 | 12/2010 |

OTHER PUBLICATIONS

International Search Report issued in corresponding application PCT/JP2013/006074, completed Nov. 6, 2013 and mailed Nov. 19, 2013.
International Preliminary Report on Patentability issued in corresponding application PCT/JP2013/006074, on Apr. 21, 2015.
Office action issued in co-pending Chinese application 201380054154.2 on Jul. 22, 2016 (no translation available; submitted for certification).
Japanese Office Action issued in corresponding application 2014-541938 on Nov. 15, 2016 (no translation available; submitted for certification).

* cited by examiner

*Primary Examiner* — Lan Vinh
(74) *Attorney, Agent, or Firm* — Griffin and Szipl PC

(57) ABSTRACT

An etching material including at least one boron compound selected from a Lewis acid that includes, in its structure, boron and a halogen that is bonded to the boron, a salt of the Lewis acid and a compound that generates the Lewis acid.

9 Claims, No Drawings

ETCHING MATERIAL

This is a National Phase Application in the United States of International Patent Application No. PCT/JP2013/006074 filed Oct. 11, 2013, which claims priority on Japanese Patent Application No. 2012-229276, filed Oct. 16, 2012. The entire disclosures of the above patent applications are hereby incorporated by reference.

TECHNICAL FIELD

The invention relates to an etching material used for removing an inorganic thin film formed of silicon nitride (SiN) or the like.

BACKGROUND ART

Inorganic thin films such as silicon oxide ($SiO_2$) and SiN are used in various semiconductor devices, solar batteries or the like as an interlayer insulating film, a passivation film, an anti-reflection film, or the like.

For example, in some solar batteries, an anti-reflection film made of a SiN film is formed on the light-receiving side and a passivation film is formed on the side opposite to the light-receiving side in order to improve conversion efficiency.

In production of a crystallized silicon solar battery cell that is a common solar battery, a phosphorus-diffused layer as the n+ layer is formed on the surface layer of p-type silicon wafer, and between the n+ layer and the p layer as an underneath layer, a pn junction is formed. Subsequently, after forming an anti-reflection film on the n+ layer, an electrode is formed on each of the light-receiving side and the back side, and, if necessary, a passivation film is formed.

In production of a solar cell, there are many cases where an electrode is connected to an n+ layer after forming an anti-reflection film or a passivation film. Therefore, it is required to form openings in these inorganic thin films.

As one of methods for forming an opening in an inorganic thin film, an etching method can be given. A method using a photoresist is a common etching method. However, this method is not efficient since it requires steps of forming a resist film, exposure, development, etching and removing of the resist, and uses a large number of materials.

Further, a method can be mentioned in which an opening is formed by means of a laser. In this method, however, control of processing positions is complicated, leading to a prolonged processing time, whereby productivity is insufficient. In addition, the underlying n+ layer, the wafer or the like may be damaged by the laser.

In addition, conventionally, as the most common production method, a conductive paste that contains a metal that is used as an electrode and a compound that constitutes glass, such as silicon oxide, is applied, and "firethrough" is caused to occur by heating, whereby an opening is formed in an inorganic thin film, and at the same time, the electrode is connected to the n+ layer. In this method, however, since a high-temperature treatment at a temperature of 250° C. or higher is required, the n+ layer or the wafer may be damaged, leading to lowering in power generation efficiency.

Meanwhile, a method can be thought that an inorganic thin film is patterned from the beginning. This method is not efficient since the steps are complicated, and pattern formation is not sufficient in respect of accuracy.

On the other hand, a method has been proposed in which an etching paste is printed to form a pattern or the like on an inorganic thin film, followed by heating, whereby an opening is formed beneath the etching paste.

As components for removing an inorganic thin film (etching components), for example, Patent Document 1 discloses an etching medium that contains phosphoric acid or phosphate. However, since the optimum etching temperature for this component is as high as 250° C. or higher, the n+ layer, wafer or the like may be damaged.

A method is disclosed (see Patent Document 2) in which an etching medium that contains at least one fluorine compound selected from a fluoride of ammonium, an alkali metal and antimony; an acid fluoride of ammonium, an alkali metal and calcium; alkylated ammonium and potassium tetrafluoroborate, and optionally, a prescribed inorganic mineral acid and a prescribed organic acid. This method, however, has a problem that an etching medium as a mixture of a fluorine compound and an acid has significant toxicity.

RELATED ART DOCUMENTS

Patent Documents

Patent Document 1: JP-T-2005-506705
Patent Document 2: JP-T-2008-527698

SUMMARY OF THE INVENTION

An object of the invention is to provide a novel etching material that can be used as an etching paste and can fully remove an inorganic thin film (SiN layer or the like) at low temperatures (250° C. or lower).

According to the invention, the following etching material or the like are provided.
1. An etching material comprising at least one boron compound selected from a Lewis acid that comprises, in its structure, boron and a halogen that is bonded to the boron, a salt of the Lewis acid and a compound that generates the Lewis acid.
2. The etching material according to 1, further comprising a solvent.
3. The etching material according to 1 or 2, wherein the boron compound has a melting point of 250° C. or lower and is non-volatile.
4. The etching material according to any one of 1 to 3, wherein the boron compound is one or more selected from triphenylcarbenium tetrafluoroborate, tropylium tetrafluoroborate, di-n-butylammonium tetrafluoroborate, tetrabutylammonium tetrafluoroborate, trimethyloxonium tetrafluoroborate, triethyloxonium tetrafluoroborate, 1-ethyl-2,3-dimethylimidazolium tetrafluoroborate, 1-butyl-1-methylpyrrolidinium tetrafluoroborate, potassium methyltrifluoroborate, potassium 4-iodophenyltrifluoroborate, potassium(4-methyl-1-piperadinyl)methyltrifluoroborate, tricyclopentylphosphine tetrafluoroborate, boron trifluoride monoethylamine complex, potassium pyridine-3-trifluoroborate and nitronium tetrafluoroborate.
5. The etching material according to any one of 1 to 4, further comprising a compound that is a non-volatile liquid at 250° C. and dissolves the boron compound.
6. The etching material according to any one of 1 to 5, wherein the boron compound is boron trifluoride monoethylamine complex.
7. The etching material according to 5 or 6, wherein the compound that dissolves the boron compound is a Lewis acid that comprises, in its structure, boron and a halogen that is bonded to the boron, a salt of the Lewis acid, a compound that generates the Lewis acid by heating, or an ionic liquid.
8. The etching material according to any one of 1 to 7, wherein the content of the boron compound is 40 to 70 mass % of the entire etching material.
9. The etching material according to any one of 2 to 8 that comprises a solvent having a vapor pressure at 25° C. of less than $1.34 \times 10^3$ Pa.
10. A base material obtained by printing the etching material according to any one of 1 to 9 on an inorganic thin film to form a pattern thereon, followed by etching by heating, whereby an opening is formed in a lower part of an etching paste.
11. A method for producing a solar battery comprising:
  a step of printing the etching material according to any one of 1 to 9 on an inorganic thin film to form a pattern thereon, followed by etching by heating, whereby an opening is formed beneath an etching paste; and
  a step of forming an electrode in the formed opening.
12. A solar battery that is obtained by using the method for producing a solar battery according to 11.

According to the invention, a novel etching material can be provided. By using the etching material of the invention, an inorganic thin film can be removed at temperatures lower than those in conventional methods.

MODE FOR CARRYING OUT THE INVENTION

The etching material of the invention contains at least one boron compound selected from a Lewis acid that contains, in its structure, boron and a halogen atom that is bonded to the boron, a salt of the Lewis acid and a compound that generates the Lewis acid.

The boron compound is a component that corrodes and removes an inorganic thin film. This component is a liquid at a heating temperature in etching, and dissolves and removes an inorganic thin film, in particular, a SiN film.

A boron compound may be a liquid or a solid at room temperature (25° C.), but is preferably a solid. It is preferable to adjust such that the etching material is a liquid at a temperature of 100° C. to 250° C. that is an etching temperature. Here, as for the "etching material is a liquid", a state in which the boron compound itself is molten at the above-mentioned temperature to become a liquid, or a state in which a boron compound is solved in a compound that is liquefied at an etching temperature can be exemplified.

Specific examples of the boron compound include tetrafluoroboric acid organic salts such as triphenylcarbenium tetrafluoroboratetetrafluoroborate, N-fluoro-N'-chloromethyltriethylenediaminebis(tetrafluoroborate), tetrafluoroborate-1-(chloro-1-pyrolidinylmethylene)pyrrolidinium, tetrafluoroborate tropylium, tetrafluoroborate-di-n-butylammonium, tetrafluoroborate tetraethylammonium, tetrafluoroborate tetrabutylammonium, tetrafluoroborate tetramethylammonium, tetrafluoroborate trimethyloxonium, tetrafluoroborate triethyloxonium, 1,3-bis(2,4,6-trimethylphenyl)-4,5-dihydroimidazolium tetrafluoroborate, 1-butyl-3-methylimidazolium tetrafluoroborate, 1-hexyl-3-methylimidazolium tetrafluoroborate, 1-ethyl-3-methylimidazolium tetrafluoroborate, 1-ethyl-2,3-dimethylimidazolium tetrafluoroborate, 1-hexyl-3-methylimidazolium tetrafluoroborate, 1-methyl-3-octylimidazolium tetrafluoroborate, 1-butyl-2,3-dimethylimidazolium tetrafluoroborate, 1,3-di-tert-butylimidazolinium tetrafluoroborate, 1-butyl-1-methylpeperidinium tetrafluoroborate, 1-butyl-3-methylpyridium tetrafluoroborate, 1-butylpyridium tetrafluoroborate, 2,4,6-trimethylpyridium tetrafluoroborate, 1-butyl-1-methylpyrrolidinium tetrafluoroborate, 1-ethyl-1-methylpyrrolidinium tetrafluoroborate, and 1-ethyl-1-methylpiperidium tetrafluoroborate, tricycicopentylphosphine tetrafluoroborate;
  tetrafluroborate halides such as tetrafluoroborate lithium;
  tetrafluorometal salts such as tetrafluoroborate copper and tetrafluoroborate zinc;
  alkyltrifluoroborate such as potassium methyltrifluoroborate, potassium(morpholine-4-yl)methyltrifluoroborate, potassium(3,3-dimethylbutyl)trifluoroborate, potassium 4-iodophenyltrifluoroborate, potassium 4-fluorophenyl trifluoroborate, potassium phenyltrifluoroborate, potassium pyridine-3-trifluoroborate, potassium vinyltrifluoroborate, potassium (4-methyl-1-piperadinyl)methyltrifluoroborate and [(N-tert-butylammonium)methyl]trifluoroborate;
  boron trifluoride complex compounds such as boron trifluoride monoethylamine complex, boron trifluoride acetic acid complex, boron trifluoride tetrahydrofuran complex, boron trifluoride phenol complex, boron trifluoride diethyl ether complex, boron trifluoride acetonitrile complex and boron trifluoride methanol complex;
  nitronium tetrafluoroborate, boron trifluoride, tris(pentafluorophenyl)boran, and tetrakis(pentaphenylfluorophenyl)borate ethyl ether complex.

Among them, triphenylcarbenium tetrafluoroborate, tetrafluoroborate tropylium, tetrafluoroborate-di-n-butylammonium, tetrafluoroborate tetrabutylammonium, tetrafluoroborate trimethyloxonium, tetrafluoroborate triethyloxonium, 1-ethyl-2,3-dimethylimidazolium tetrafluoroborate, 1-butyl-1-methylpyrrolidinium tetrafluoroborate, potassium methyltrifluoroborate, potassium 4-iodophenyltrifluoroborate, potassium (4-methyl-1-piperadinyl) methyltrifluoroborate, tricyclopentylphosphine tetrafluoroborate, boron trifluoride monoethylamine complex, potassium pyridine-3-trifluoroborate, nitronium tetrafluoroborate, boron triiodide, tris(pentafluorophenyl)boran, and lithium tetrakis(pentafluorophenyl)borate ethyl ether complex are preferable. Further, di-n-butylammonium tetrafluoroborate, tetrabutylammonium tetrafluoroborate, boron trifluoride monoethylamine complex are preferable. In particular, boron trifluoride monoethylamine complex is preferable.

It is preferred that the boron compound have a melting point of 250° C. or lower, and be non-volatile when liquefied. As a result, etching components can be liquefied singly at temperatures at which an inorganic thin film is removed, and deformation or the like of a pattern by evaporation of the etching components can be suppressed.

In the meantime, the "non-volatile" as referred to herein means that 50 mass % or more of the etching components can be remained without volatilization during processing at an etching temperature. It refers to a case where the boron compound has a boiling point of at least higher than the etching temperature, and desirably has a vapor pressure at an etching temperature of 350 Pa or less.

It is preferred that the etching material of the invention contain a solvent in addition to the boron compound mentioned above. Due to the presence of a solvent, the viscosity or the printing properties of the etching material can be improved. The solvent is not particularly restricted as long as it can disperse the above-mentioned boron compound. When the etching material of the invention is printed by screen printing, since the printing properties may vary due to a change in viscosity that is caused by evaporation of a solvent during printing, the vapor pressure at 25° C. is preferably less than $1.34 \times 10^3$ Pa, preferably less than $1.0 \times 10^3$ Pa.

As the solvent, aliphatic hydrocarbon solvents such as nonane, decane, dodecane and tetradecane; aromatic hydrocarbon solvents such as ethylbenzene, anisole, mesitylene, naphthalene, cyclohexyl benzene, diethyl benzene, phenyl acetonitrile, phenyl cyclohexane, benzonitrile, and mesitylene; ester solvents such as isobutyl acetate, methyl propionate, ethyl propionate, γ-butyrolactone, glycol sulfite, ethyl lactate and ethyl lactate; alcohol solvents such as 1-butanol, cyclohexanol and glycerin; terpene solvents such as terpineol, terpineol C, dihydroterpineol, dihydroterpinyl acetate, Tersolve DTO-210, Tersolve THA-90, Tersolve THA-70, Tersolve TOE-100, dihydroxy terpinyl oxyethanol, terpinyl methyl ether, dihydroterpinyl methyl ether and Tersolve MTPH; ketone solvents such as cyclohexanone, 2-hexanone, 2-heptanone, 2-octanone, 1,3-dioxolan-2-one, and 1,5,5-trimethylcyclohexen-3-one; an alkylene glycol solvent such as diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol ethyl ether acetate, diethylene glycol propyl ether acetate, diethylene glycol isopropyl ether acetate, diethylene glycol butyl ether acetate, diethylene-t-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol-t-butyl ether acetate, dipropylene glycol dimethyl ether, and dipropylene glycol monobutyl ether; ether solvents such as dihexyl ether, butyl phenyl ether, pentyl phenyl ether, methoxytoluene and benzyl ethyl ether; carbonate solvents such as propylene carbonate and ethylene carbonate; amide solvents such as N,N-dimethylformamide, N,N-dimethylacetamide and N-methylpyrrolidone; and nitrile solvents such as an malononitrile, can be exemplified.

Among these, terpineol, γ-butyrolactone, N-methylpyrrolidone, glycol sulfite and propylene carbonate are preferable.

These solvents can be used singly or in combination of two or more.

The content of the boron compound may appropriately be adjusted taking into consideration the properties of the etching material during use. A higher content of the boron compound as the etching component is preferable. However, in view of the application of a composition by a printing method, control of viscosity or properties of a paste is important. The content of the boron compound is preferably 30 to 80 mass %, particularly preferably 50 to 70 mass %, relative to the entire etching material.

The content of the solvent may appropriately be adjusted taking into consideration the properties of the composition during use. Normally, the content of the solvent is preferably 15 to 65 mass %, particularly preferably 25 to 50 mass %, relative to the entire etching material.

In order to improve printing properties, the boron compound as the etching component preferably has a particle size before mixing of 100 μm or less.

Meanwhile, the particle size as referred to herein means a number-average particle size, and can be obtained as an average value of 100 particles that are selected at random and are not overlapped one on another in a SEM observation image. Specifically, the particle size is obtained as follows. A carbon adhesive tape is adhered to a sample table of a SEM, and etching components are sprinkled over the tape. Of the etching components placed on the sample table, those are not adhered to the tape are blown off by means of an air gun. For the SEM sample table on which the etching components are adhered, by means of a vacuum sputtering apparatus (for example, ION SPUTTER, manufactured by Hitachi High-Tech Solutions Corporation), Pt is deposited by sputtering in a thickness of 10 to 20 nm to obtain a sample for SEM. This sample for SEM is observed by a SEM apparatus (for example, ESEM XL30, manufactured by Koninklijke Philips N.V.) at an applied voltage of 10 kV. The magnification is selected such that the diameter of an averagely conductive particle occupies about 10% of the visual field. From the thus observed particle image, etching components that are overlapped one on another and the outer shape therefore cannot be confirmed are excluded, and from the remaining particles, 100 particles are selected at random. Among the parallel two straight lines that circumscribe each of the etching component images, two straight lines that are apart from each other with the maximum distance are selected and the distance between the lines is measured. An average value of these 100 values is obtained and the value is taken as the number average particle size. If 100 particles are not selected from one visual field, measurement is conducted in two or more visual fields.

The particle diameter of the boron compound after dispersion (dispersion particle diameter) is preferably 100 μm or less in view of screen printing accuracy. In respect of viscosity properties, the particle diameter is preferably 0.01 μm or more.

The dispersion particle size is determined as a volume average particle diameter obtained by using a laser scattering particle size distribution analyzer. Specifically, a laser scattering particle size distribution measuring apparatus (L513 320, manufactured by Beckman Coulter Inc., for example) equipped with a universal liquid module is used. For stabilizing a light source, the apparatus is allowed to stand for 30 minutes after turning the power of the main body on. Then, only the solvent used in the etching material is introduced by the Rinse command in the measurement program. In the measurement program, De-bubble, Measure Offset, Align and Measure Background are executed. Then, by using the Measure Loading of the measurement program, the etching material is added to the liquid module until indication of the measurement program changes to the Sample amount OK from the Sample amount LOW. Then, Measure in the measurement program is executed to obtain the particle size distribution. As for the settings for the laser scattering particle size distribution analyzer, the following is used: Pump Speed: 70%, Include PIDS data: ON, Run Length: 90 seconds. The refractive index of the dispersoid and the dispersion medium, the refractive index of each of the solvent and the boron compound is used.

It is preferred that the etching material of the invention be a non-volatile liquid at 250° C., and contain compounds (component (A)) that dissolve the boron compound. As a result, more options can be created for compounds usable as etching components. Further, the temperature at which an inorganic thin film is removed can be set lower, and the etching rate is also improved.

As the component (A), a Lewis acid that contains, in its structure, boron and a halogen that is bonded to the boron, a salt of the Lewis acid, a compound that generates the Lewis acid or an ion liquid can be given.

As for the Lewis acid that contains boron and a halogen that is bonded to the boron, a salt of the Lewis acid and the compound that generates the Lewis acid, the same as those mentioned above for the etching material can be mentioned. From the examples given above, those dissolve the etching components may be selected.

As the ion liquid (ionic liquid), a known ion liquid can be used. It is preferable that an anion in the ion liquid contain fluorine. Specific examples of the anion include tetrafluoroboric acid ion and hexafluorophosphoric acid ion.

As the cation of the ion liquid, imidazolium cation, pyridium cation or the like can be mentioned.

As specific examples of the component (A), imidazolium salts such as 1,3-bis(2,4,6-trimethylphenyl)-4,5-dihydroimidazolium tetrafluoroborate, 1-butyl-3-methylimidazolium tetrafluoroborate, 1-hexyl-3-methylimidazolium tetrafluoroborate, 1-ethyl-3-methylimidazolium tetrafluoroborate, 1-ethyl-2,3-dimethylimidazolium tetrafluoroborate, 1-hexyl-3-methylimidazolium tetrafluoroborate, 1-methyl-3-octyl-imidazolium tetrafluoroborate, 1-butyl-2,3-dimethyl-imidazolium tetrafluoroborate, 1,3-di-tert-butylimidazolium tetrafluoroborate, 1-ethyl-3-methylimidazolium hexafluorophosphate and 1-methyl-3-octylimidazolium hexafluorophosphate;

pyridinium salts such as 1-butyl-3-methylpyridinium tetrafluoroborate, 1-butylpyridinium tetrafluoroborate, 2,4,6-trimethylpyridinium tetrafluoroborate and 1-butyl-4-methylpyridinium hexafluorophosphate;

piperidinium salts such as 1-butyl-1-methylpiperidinium tetrafluoroborate, 1-ethyl-1-methylpiperidinium tetrafluoroborate and 1-butyl-1-methylpiperidinium hexafluorophosphate; and pyrrolidinium salts such as 1-butyl-1-methylpyrrolidinium tetrafluoroborate, 1-ethyl-1-methylpyrrolidinium tetrafluoroborate and 1-butyl-1-methylpyrrolidinium hexafluorophosphate, are preferable.

The content of the component (A) is preferably 3.0 to 64.0 mass % relative to the entire liquid composition, with 5.0 to 56.0 mass % being particularly preferable.

The etching material of the invention may optionally contain, if necessary, in addition to the components mentioned above, other components such as a thixotropy-imparting agent, an agent for adjusting wettability to a substrate, a particle dispersing agent, a defoaming agent, an external appearance improving agent to prevent orange peel or the like (levelling agent), an additive such as an additive for accelerating uniform drying, a material for adjusting viscosity (fine particles or a solvent, an additive), a doping agent and a pH adjusting agent.

According to the printing method, it is preferable to impart thixotropy in order to attain thin line drawing performance. As the method for imparting thixotropy, a method in which a thixotropy-imparting agent is used or a method in which fine particles are dispersed are given. These methods may be used in combination.

As the thixotropy-imparting agent, ethyl cellulose and commercially-available agents such as BYK-405, 410, 411, 415, 420, 425, 420, 430, 431 or the like (BYK Japan K.K.), Disparlong thixotropic series (Kusumoto Chemicals, Ltd.) or the like can be mentioned. No specific restrictions are imposed on the thixotropy-imparting agent, as long as it is miscible with a solvent used and intended thixotropy is obtained.

Further, polysiloxane, polyacryl, polyamide, polyvinyl alcohol, alkyl-modified cellulose, peptide, polypeptide, and a copolymer having two or more structures among them are also preferable.

As the fine particles, organic fine particles and inorganic fine particles such as metal oxide particles can be given. By adding the fine particles, the viscosity or the thixotropy can be appropriately adjusted, whereby printing properties (for example, thin line drawing performance or shape-retaining properties) or etching properties can be controlled. Further, if heated to the etching temperature of an inorganic thin film, the etching components become liquid. However, the fluidity is suppressed by the particles, whereby the printed shape of the SiN liquid composition can be prevented from being deformed.

As the organic fine particles, for example, polystyrene beads, polyethylene particles, acrylic particles, polysiloxane resin particles, isoprene rubber particles, and polyamide particles can be exemplified.

As the inorganic fine particles, metal oxide particles such as copper oxide, copper hydroxide, iron oxide, alumina, zinc oxide, lead oxide, magnesia, and tin oxide, calcium carbonate, carbon, silica, mica and smectite can be exemplified.

In the case of particles of which the surfaces are electrically attracted, they form an agglomerate in the liquid composition. Therefore, similar effects can be expected.

The primary particle shape of the fine particles can be selected from a nearly spherical shape, a needle-like shape, a plate-like shape and a rice grain-like shape or the like. In particular, when imparting thixotropy is intended, it is preferred that the fine particles have a needle-like shape, a plate-like shape, a rice grain-like shape or a beads-like shape.

In order to allow the fine particles to be dispersed, within a range that does not impair the attainment of the object, a dispersion aid or a dispersion stabilizer can be added.

The longer axis (longer side length) of the fine particles is preferably 10 nm to 10 μm. The longer axis (longer side length) of the fine particles can be obtained by the same method as the method for obtaining the particle diameter of the etching components mentioned above from an SEM observation image.

It is preferred that the content of an agent for imparting thixotropy be 0.1 to 5.0 mass % relative to the entire etching material. If the content is less than 0.1 mass %, effects sufficient for developing thixotropy may not be necessarily obtained. On the other hand, if the content exceeds 5.0 mass %, the viscosity may be too large. The content of a thixotropy-imparting agent is preferably 1.0 to 4.0 mass %.

The etching material of the invention may preferably contain a boron compound, and may further optionally contain a solvent, the component (A), and other components (for example, fine particles for controlling the viscosity).

The etching material of the invention may substantially comprise a boron compound, a solvent, the component (A) and other components or may consist only of them.

The etching material of the invention can be produced by mixing the boron compound, and the solvent, the additive or the like mentioned above that are optionally compounded.

In order to improve the homogeneity of the etching material, it is preferable to conduct mixing by means of a propeller agitator, an ultrasonic dispersion apparatus (e.g. an ultrasonic homogenizer manufactured by Nissei Corporation), a planetary centrifugal mixer (e.g. Awa Tori Rentaro, manufactured by Thinky), a high-speed emulsifier/disperser (e.g. TK homo mixer series manufactured by Primix Corporation), a Raikai mixer, a triple roll mill, a beads mill, a sand mill, a pot mill or the like. Dispersion can be conducted by using these apparatuses singly or in combination.

If bubbles are generated in the mixed composition after dispersion, the bubbles in the composition can be removed by allowing it to be under reduced pressure, de-foaming by stirring under reduced pressure, or by other methods.

The etching material of the invention can be preferably used as an etching paste or the like for an inorganic thin film, in particular, a SiN film.

The etching material of the invention can be applied to screen printing, flexo printing, micro-contact printing or the like as the printing with a printing plate and can be applied to ink jet printing, slit printing, dispenser printing or the like as the printing without a printing plate.

Among the printing methods, a printing method in which non-contact patterning is possible is preferable since it can avoid damage on a substrate by applying printing pressure.

The viscosity of the etching material depends on the printing method or the printing apparatus, and is not particularly restricted, and it can be adjusted such that it is suited to various printing methods.

For example, in the screen printing, it is preferred that the viscosity at 25° C. be 100 mPa·s or more, in particular 1 Pa·s or more.

In the inkjet printing, a viscosity of 3 to 20 mPa·s is generally preferable.

The method for removing a SiN film by using an etching material has a step of forming the etching material of the invention on a SiN film by a printing method (printing step) and a step of removing the SiN film by heating (etching step).

For example, by printing the etching material of the invention on an inorganic thin film to form a pattern thereon, followed by heat etching, whereby a substrate with an opening that is formed beneath the etching paste can be produced.

As a substrate on which an inorganic thin film is formed, an inorganic substance, e.g., silicon wafer or glass, other metals, organic products or the like can be used. However, the substrate on which an inorganic thin film is constituted is not limited thereto.

A SiN film can be used as an interlayer insulating film, a passivation film or the like of a semiconductor device such as CMOS or an anti-reflection film of a solar cell or the like. A SiN film can be formed by a known method such as chemical vapor method (CVD). The "SiN" does not mean the chemical stoichiometric ratio (Si:N) is 1:1.

When the etching material of the invention is used in the method for producing a solar cell, it is preferred that the method include a step in which a pattern is formed on an inorganic thin film (for example, a SiN film) by printing the etching material of the invention, followed by heat etching to form an opening beneath the etching paste, and a step in which an electrode is formed in the formed opening.

In the printing step, by the above-mentioned known printing method, a desired pattern is formed on a SiN film. The SiN film positioned beneath the pattern is finally removed (removed by etching).

After the printing, if necessary, the solvent of the etching material is evaporated and removed by heating or pressure reduction. Removal of the solvent may be conducted simultaneously with the heating in the etching step. However, temperature conditions for the solvent removal and the heating during the etching step may be different, and hence, appropriate selection is required to be made.

In the etching step, heating is conducted at 100 to 250° C., more preferably 100 to 200° C. for 1 to 60 minutes. If the temperature exceeds 250° C., in the case of a solar cell, for example, a dopant doped in the n+ layer or the like is diffused, and a mutual diffusion layer is generated in a P type/N type interface, whereby the properties of a solar cell may be lowered.

After the etching, if there are any residual matters, a cleaning step is provided in order to remove the residual matters.

As the cleaning step, an ultrasonic cleaning using pure water, brush cleaning, spray cleaning, cleaning with running water or the like can be given.

The method for removing a SiN film of the invention can be applied to a substrate having a SiN film. As the substrate, if it is composed mainly of Si, glass (quarts, window glass, borosilicate glass, non-alkaline glass), silicon wafer or the like can be exemplified. A SiN film may contain impurities according to purpose, or may be oxidized. The shape of the surface is not restricted.

A substrate obtained by removing a SiN film by using the method of the invention serves as an intermediate processing product in various semiconductor devices or solar batteries. For example, in the case of a solar cell, after removing a SiN film, by forming a power supply wiring (electrode) with a metal paste or the like, a solar battery can be produced. In the meantime, an n+ part may be formed by doping an exposed silicon surface with a dopant such as phosphorus.

EXAMPLES

Example 1

(1) Preparation of an Etching Material 25 g of boron trifluoride monoethyl amine complex (melting point: 88° C.) (manufactured by Wako Pure Chemical Industries, Inc.) was ground in an automatic mortar for 9 hours. After passing through a 100 µm-sieve, fine powder of boron trifluoride monoethyl amine complex was obtained.

6.87 g of fine powder of the boron trifluoride monoethyl amine complex, 0.13 g of silica particles (AEROSIL R202, Nippon Aerosil Co., Ltd.) and 3.5 g of a terpineol isomer were mixed in an agate mortar to obtain an etching material (SiN etching paste).

(2) Printing of SiN Etching Paste and Etching of SiN Film

A P-type silicon wafer (1 to 50Ω) (Mito Seiko Corporation) obtained by stacking a 150 nm-film of $SiO_2$ and a 90 nm-film of SiN on a mirror surface by PE-CVD was used as a silicon substrate provided with SiN.

By screen printing, the SiN etching paste was printed such that a 5 cm×5 cm square and lines having widths of 50 µm, 75 µm and 100 µm were printed on the SiN film.

The printed silicon substrate provided with the SiN film was subjected to a heat treatment on a hot plate heated to 200° C. for 30 minutes. The substrate was then allowed to cool, and subjected to ultrasonic cleaning in ultrapure water.

In the silicon substrate provided with the SiN film after the etching, the SiN film beneath the printed part was removed.

Example 2

An etching material was produced in the same manner as in Example 1, except that 0.35 g of long-grain shaped (grain diameter: 200 nm, aspect ratio: 3) copper oxide nanoparticles (self-synthesized products) was used instead of silica particles, and printing and etching were conducted.

As a result, it was revealed that, in a silicon substrate with a SiN film after etching, the SiN film beneath the printed part was removed.

Experimental Example

On the same SiN film as that used in Example 1, a small amount of a boron fluoride reagent shown in Table 1 was placed, and the resultant was heated on a hot plate of 200° C. for 30 minutes. The state at the time of heating (200° C.) and the result of etching of the SiN film are shown in Table 1.

TABLE 1

| Boron fluoride reagent | State at 200° C. | Results of etching |
|---|---|---|
| Trifluoroborate monomethylamine complex | Liquid | Good |
| 1-Butyl-3-methylimidazolium hexafluorophosphate (ion liquid) | Liquid | Poor |
| Boric acid | Liquid | Poor |

As for the result of etching shown in Table 1, a case where after the SiN layer was removed by etching, the film thickness was decreased (measured by means of a laser interference film thickness measuring device or an ellipsometer) was evaluated as "good" and a case where the film thickness was not changed was evaluated as "poor".

INDUSTRIAL APPLICABILITY

The etching material of the invention is preferable for removing an inorganic thin film formed of silicon nitride (SiN), or the like.

The method for removing a SiN film of the invention can be used in a method for producing various semiconductor devices or solar batteries.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The documents described in this specification and the specification of the Japanese patent application to which the present application claims priority under the Paris Convention are incorporated herein by reference in their entirety.

The invention claimed is:

1. An etching material comprising:
   (i) at least one boron compound selected from a group consisting of a Lewis acid that comprises, in a structure of the Lewis acid, boron and a halogen that is bonded to the boron, a salt of the Lewis acid, and a compound that generates the Lewis acid; and
   (ii) a compound that is a non-volatile liquid at 250° C. and dissolves the boron compound,
   wherein the boron compound has a melting point of 250° C. or lower and is non-volatile, and
   wherein the boron compound is one or more selected from the group consisting of triphenylcarbenium tetrafluoroborate, tetrafluoroborate tropylium, tetrafluoroborate-di-n-butylammonium, tetrafluoroborate trimethyloxonium, tetrafluoroborate triethyloxonium, 1-ethyl-2,3-dimethylimidazolium tetrafluoroborate, 1-butyl-1-methylpyrrolidinium tetrafluoroborate, potassium methyltrifluoroborate, potassium 4-iodophenyltrifluoroborate, potassium (4-methyl-1-piperadinyl)methyltrifluoroborate, tricyclopentylphosphine tetrafluoroborate, boron trifluoride monoethylamine complex, potassium pyridine-3-trifluoroborate, nitronium tetrafluoroborate, boron triiodide, tris(pentafluorophenyl)boran, and lithium tetrakis(pentafluorophenyl)borate ethyl ether complex.

2. The etching material according to claim 1, wherein the boron compound is boron trifluoride monoethylamine complex.

3. The etching material according to claim 1, wherein the compound that dissolves the boron compound is a Lewis acid that comprises, in a structure of the Lewis acid, boron and a halogen that is bonded to the boron, a salt of the Lewis acid, a compound that generates the Lewis acid by heating, or an ionic liquid.

4. The etching material according to claim 1, wherein the content of the boron compound is 40 to 70 mass % of the entire etching material.

5. A method for producing a base material, the method comprising the steps of:
   (1) printing the etching material according to claim 1 on an inorganic thin film to form a pattern thereon;
   (2) following the printing step, etching an opening in a lower part of an etching paste by thermal etching.

6. A method for producing a solar battery, the method comprising the steps of:
   (1) printing the etching material according to claim 1 on an inorganic thin film to form a pattern thereon;
   (2) following the printing step, etching an opening beneath an etching paste by thermal etching; and
   (3) forming an electrode in the formed opening.

7. The etching material according to claim 1, further comprising a solvent.

8. The etching material according to claim 7 that comprises a solvent having a vapor pressure at 25° C. of less than $1.34 \times 10^3$ Pa.

9. An etching material comprising:
   (i) at least one boron compound selected from a group consisting of a Lewis acid that comprises, in a structure of the Lewis acid, boron and a halogen that is bonded to the boron, a salt of the Lewis acid, and a compound that generates the Lewis acid; and
   (ii) a compound that is a non-volatile liquid at 250° C. and dissolves the boron compound,
   wherein the boron compound has a melting point of 250° C. or lower and is non-volatile, and
   wherein the boron compound is one or more selected from the group consisting of triphenylcarbenium tetrafluoroborate, tropylium tetrafluoroborate, di-n-butylammonium tetrafluoroborate, trimethyloxonium tetrafluoroborate, triethyloxonium tetrafluoroborate, 1-ethyl-2,3-dimethylimidazolium tetrafluoroborate, 1-butyl-1-methylpyrrolidinium tetrafluoroborate, potassium methyltrifluoroborate, potassium 4-iodophenyltrifluoroborate, potassium(4-methyl-1-piperadinyl)methyltrifluoroborate, tricyclopentylphosphine tetrafluoroborate, boron trifluoride monoethylamine complex, potassium pyridine-3-trifluoroborate and nitronium tetrafluoroborate.

* * * * *